(12) United States Patent
Kuo

(10) Patent No.: US 12,092,665 B2
(45) Date of Patent: Sep. 17, 2024

(54) DETECTION RESULT RECORDING AND OUTPUTTING DEVICE

(71) Applicant: REALTEK SEMICONDUCTOR CORPORATION, Hsinchu (TW)

(72) Inventor: Chun-Yi Kuo, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 163 days.

(21) Appl. No.: 17/987,903

(22) Filed: Nov. 16, 2022

(65) Prior Publication Data

US 2023/0152356 A1    May 18, 2023

(30) Foreign Application Priority Data

Nov. 18, 2021    (TW) .................................. 110142970

(51) Int. Cl.
*G01R 19/165*    (2006.01)
(52) U.S. Cl.
CPC . *G01R 19/16552* (2013.01); *G01R 19/16571* (2013.01)
(58) Field of Classification Search
CPC ........ G01R 19/16552; G01R 19/16571; G01R 31/2856; G01R 31/31703
See application file for complete search history.

(56) References Cited

U.S. PATENT DOCUMENTS

| | | | | |
|---|---|---|---|---|
| 8,354,857 B1* | 1/2013 | Rosen | .............. | G01R 31/31725 324/762.01 |
| 2010/0153034 A1* | 6/2010 | Kosugi | .................... | H04L 1/24 702/58 |
| 2015/0098281 A1* | 4/2015 | Byeon | ..................... | G11C 8/12 327/540 |
| 2018/0348298 A1* | 12/2018 | Bhagwat | .......... | G01R 31/31723 |
| 2020/0371537 A1* | 11/2020 | Lin | .......................... | G05F 1/625 |
| 2022/0036962 A1* | 2/2022 | Kuo | ..................... | G11C 29/028 |

* cited by examiner

*Primary Examiner* — Jay Patidar
(74) *Attorney, Agent, or Firm* — WPAT, P.C

(57) ABSTRACT

A detection result recording and outputting device of an IC is operable to record and output detection results at different speeds respectively. The device includes a sensing circuit, a decision circuit, a storage circuit, and a control circuit. The sensing circuit detects the variation in a characteristic of a target circuit and generates detection results at a first speed. The decision circuit receives the detection results and generates a trigger signal or changes its level when finding that a detection result satisfies a predetermined condition. The control circuit writes the detection result and subsequent (N−1) detection results into the storage circuit at a second speed according to the trigger signal, and then reads out the detection results from the storage circuit at a third speed and outputs them at a fourth speed. The second speed is not higher than the first speed, but higher than the fourth speed.

12 Claims, 4 Drawing Sheets

DETECTION RESULT RECORDING AND OUTPUTTING DEVICE

BACKGROUND OF THE INVENTION

1. Field of the Invention

The present disclosure relates to a detection result recording and outputting device, especially to a detection result recording and outputting device of an integrated circuit.

2. Description of Related Art

An IR drop may occur in an integrated circuit (IC) when the operating environment or workload of the IC changes. A user may like to know the IR drop trend and voltage profile of some circuits in the IC to determine how to optimize the performance of the IC.

However, the IR drop in circuits of an IC changes very fast (e.g., by nanoseconds) while the input/output (I/O) interface of the IC operates relatively slow (e.g., by microseconds), and thus it is very difficult for a user to observe the IR drop in the circuits of the IC through the I/O interface of the IC.

SUMMARY OF THE INVENTION

An object of the present disclosure is to provide a detection result recording and outputting device of an IC capable of recording detection results at a speed and outputting the detection results at another speed.

An embodiment of the detection result recording and outputting device of the present disclosure includes a sensing circuit, a decision circuit, a storage circuit, and a control circuit. The sensing circuit is configured to detect a variation in a characteristic of a target circuit and generate multiple detection results according to the variation at a first speed. The decision circuit is configured to receive the multiple detection results, and generate a trigger signal or changes a level of the trigger signal when finding that a first detection result of the multiple detection results satisfies a predetermined condition, wherein the first detection result satisfies the predetermined condition firstly among the multiple detection results. The control circuit is configured to start writing the first detection result and subsequent (N−1) detection result(s) of the multiple detection results into the storage circuit at a second speed according to the trigger signal when the first detection result satisfies the predetermined condition; and the control circuit is further configured to start reading out N detection results including the first detection and the subsequent (N−1) detection result(s) from the storage circuit at a third speed when M detection result(s) of the N detection results is/are written into the storage circuit, and configured to output the N detection results read from the storage circuit to an output interface of the integrated circuit at a fourth speed. The second speed is not higher than the first speed but higher than the fourth speed, the N is an integer greater than one, the M is a positive integer and not greater than the N.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present specification discloses a detection result recording and outputting device of an integrated circuit (IC). The device can record detection results of a target circuit at a speed and output the detection results to an output interface of the IC at another speed even though the detection results are generated at a speed faster than the operating speed of the output interface of the IC.

Figure 1:
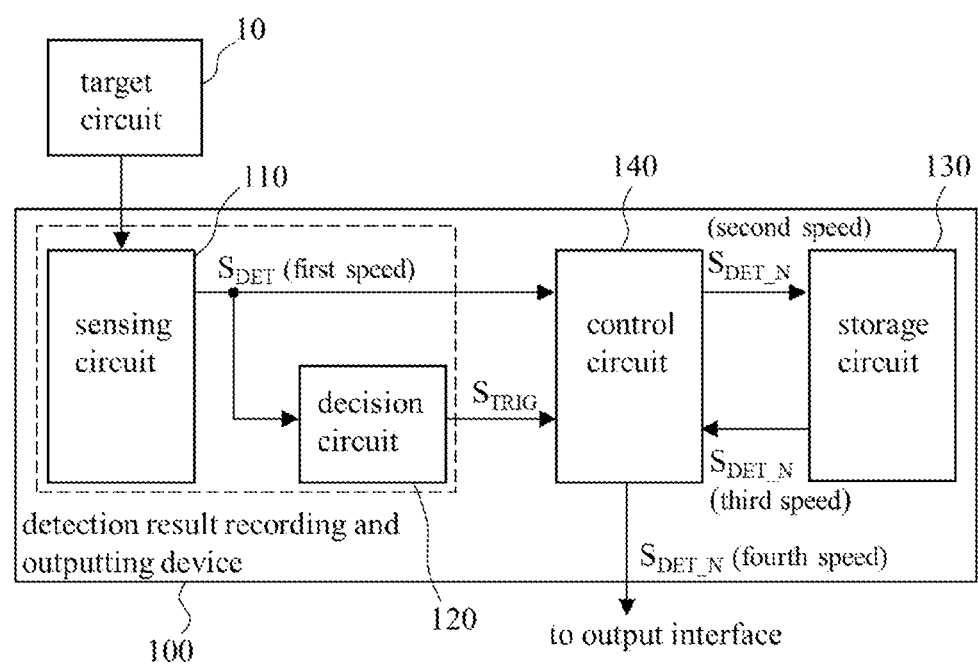
FIG. 1 shows an embodiment of the detection result recording and outputting device of the present disclosure.

FIG. 1 shows an embodiment of the detection result recording and outputting device of the present disclosure. The detection result recording and outputting device 100 of FIG. 1 includes a sensing circuit 110, a decision circuit 120, a storage circuit 130, and a control circuit 140, wherein the sensing circuit 110 and the decision circuit 120 can optionally be integrated into one sensor as illustrated with the dashed lines of FIG. 1.

In regard to the embodiment of FIG. 1, the sensing circuit 110 is configured to detect a variation in a characteristic of a target circuit 10, and to generate multiple detection results $S_{DET}$ according to the variation at a first speed. Both the target circuit 10 and the detection result recording and outputting device 100 are included in the same IC (not shown in FIG. 1), and thus the detection result recording and outputting device 100 can record the variation in the characteristic of the target circuit 10 in real time. In an exemplary implementation, the sensing circuit 100 includes an operating speed detection circuit (not shown in FIG. 1) that is configured to detect an operating speed of the target circuit 10 and thereby generate the multiple detection results $S_{DET}$, wherein the variation in the characteristic of the target circuit 10 here is a variation in the operating speed. Examples of the operating speed detection circuit are found in Applicant's US patent of the patent number U.S. Pat. No. 10,763,836B2 (hereinafter referred to as "the '836 patent") and the US patent application publication of the publication number 20220036962A1 (hereinafter referred to as "the '962 publication"). In an exemplary implementation, the sensing circuit 110 includes an analog-to-digital converter (not shown in FIG. 1) that is configured to detect a power or a voltage of the target circuit 10 and thereby generate the multiple detection results $S_{DET}$, wherein the variation in the characteristic of the target circuit 10 here is a variation in the power or a variation in the voltage. The above-mentioned operating speed detection circuit and analog-to-digital converter can be realized with known/self-developed technologies, and their detail falls beyond the scope of the present disclosure.

In regard to the embodiment of FIG. 1, the decision circuit 120 is configured to receive the multiple detection results $S_{DET}$, and to generate a trigger signal $S_{TRIG}$ or changes a level of the trigger signal $S_{TRIG}$ when finding that a first detection result of the multiple detection results $S_{DET}$ satisfies a predetermined condition, wherein the first detection result satisfies the predetermined condition firstly among the multiple detection results $S_{DET}$. In an exemplary implementation, each of the multiple detection results $S_{DET}$ is a digital value, the predetermined condition is a threshold value, and the decision circuit 120 is configured to determine whether the digital value reaches the threshold value and thereby determine whether some or all of the multiple detection results $S_{DET}$ satisfy the predetermined condition. For example, the digital value is "the number of enabled delay units" described in the '836 patent or "the margin of a circuit" described in the '962 publication, or the digital value is the output of the aforementioned analog-to-digital converter; the decision circuit 120 is configured to determine whether the digital value is equal to and/or smaller than the threshold value and in this way to determine whether some or all of the multiple detection results $S_{DET}$ satisfy the predetermined condition.

In regard to the embodiment of FIG. 1, an embodiment of the storage circuit 130 is a memory (e.g., static random access memory, SRAM). In an exemplary implementation, the storage circuit 130 has a maximum storage capacity of N detection results, wherein the N is an integer greater than one. In an exemplary implementation, when the storage circuit 130 stores M detection result(s), the control circuit 140 actively starts reading out detection results from the storage circuit 130, wherein the M is a positive integer and not greater than the N. For example, the control circuit 140 includes a counter (not shown in FIG. 1) configured to count detection results written into the storage circuit 130, and when a total number of the detection results written into the storage circuit 130 reaches the M, the counter requests the control circuit 140 to start reading out detection results from the storage circuit 130; in addition, when the total number reaches the N, the counter requests the control circuit 140 to stop writing any detection result into the storage circuit 130. In an exemplary implementation, when the storage circuit 130 stores the M detection result(s), the storage circuit 130 actively notifies the control circuit 140 of the above-mentioned event and thereby requests the control circuit 140 to start reading out detection results from the storage circuit 130.

In an exemplary implementation on the basis of the above description, the M is smaller than the N; when the storage circuit 130 stores M detection result(s), the control circuit 140 actively starts reading out detection results from the storage circuit 130, and after the control circuit 140 starts reading out the detection results from the storage circuit 130, the storage circuit 130 continues receiving and storing the following detection results till the storage circuit 130 stores N detection results in total; accordingly, the control circuit 140 reads out N detection results from the storage circuit 130 in total. In an exemplary implementation, the M is equal to the N, and when the storage circuit 130 stores N detection results in total, the storage circuit 130 stops storing any detection result coming after the N detection results, and the control circuit 140 starts reading out the N detection results from the storage circuit 130.

In regards to the embodiment of FIG. 1, the control circuit 140 is configured to receive the multiple detection results $S_{DET}$ in sequence at the aforementioned first speed, and also configured to write the aforementioned first detection result and (N−1) detection result(s) of the multiple detection results $S_{DET}$ into the storage circuit 130 at a second speed according to the aforementioned trigger signal $S_{TRIG}$ when the first detection result satisfies the predetermined condition, wherein the first detection result and the (N−1) detection result(s) amount to N detection results $S_{DET\_N}$, and the (N−1) detection result(s) is/are subsequent to the first detection result in the timeline. The control circuit 140 is further configured to start reading out the N detection results $S_{DET\_N}$ from the storage circuit 130 at a third speed when M detection result(s) of the N detection results is/are written into the storage circuit 130, and to output the N detection results $S_{DET\_N}$ read from the storage circuit 130 to an output interface (not shown in FIG. 1) of the aforementioned IC at a fourth speed. An example of the output interface is an input/output (I/O) interface of the IC, or a register interface of the IC.

In light of the preceding paragraphs, the first speed correlates with the speed of the variation in the characteristic of the target circuit 10, and accordingly the first speed is very high. Each of the second speed and the third speed correlates with how fast the storage circuit 130 is accessed, and can be equal to or slower than the first speed; for example, the first speed is K times the second/third speed, wherein the K is an integer greater than one. The third speed can be equal to or different from the second speed, and this is dependent on the demand for implementation. The fourth speed is limited to the operating speed of the I/O interface, and thus the fourth speed is slower than the second speed; on condition that the third speed is slower than the second speed, the fourth speed can be equal to or different from the third speed.

Figure 2A:
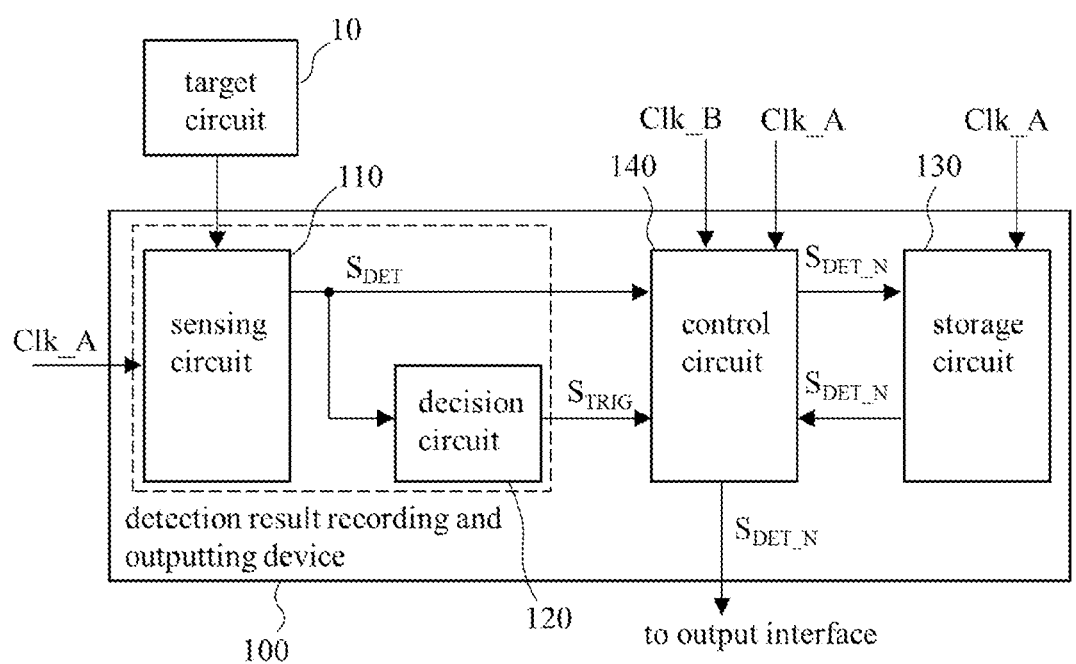
FIG. 2a shows an embodiment of the detection result recording and outputting device of FIG. 1 operating according to clocks.
Figure 2B:
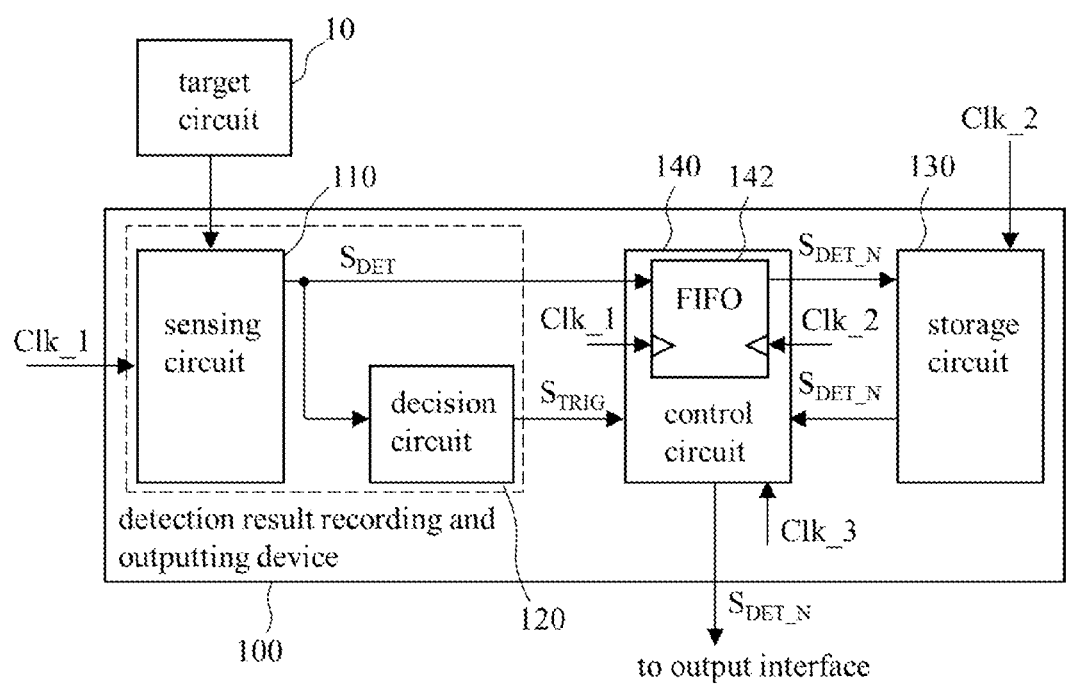
FIG. 2b shows another embodiment of the detection result recording and outputting device of FIG. 1 operating according to clocks.

FIG. 2a shows an embodiment of the detection result recording and outputting device 100 of FIG. 1 operating according to clocks. As shown in FIG. 2a, the sensing circuit 110 outputs the multiple detection results $S_{DET}$ to the control circuit 140 according to a clock Clk_A; the storage circuit 130 receives the N detection results $S_{DET\_N}$ from the control circuit 140 according to the clock Clk_A; the control circuit 140 forwards the N detection results $S_{DET\_N}$ to the storage circuity 130 according to the clock Clk_A; and the control circuit 140 receives the N detection results $S_{DET\_N}$ and then outputs the N detection results $S_{DET\_N}$ according to a clock Clk_B, wherein the speed of the clock Clk_B (i.e., the clock frequency) is slower than the speed of the clock Clk_A. FIG. 2b shows another embodiment of the detection result recording and outputting device 100 of FIG. 1 operating according to clocks, wherein the control circuit 140 includes an asynchronous first in first out (FIFO) 142. As shown in FIG. 2b, the asynchronous FIFO 142 receives the multiple detection results $S_{DET}$ from the sensing circuit 110 according to a clock Clk_1, and writes the N detection results $S_{DET\_N}$ into the storage circuit 130 according to a clock Clk_2; and the control circuit 140 reads out the N detection results $S_{DET\_N}$ from the storage circuit 130 according a clock Clk_3 and outputs the N detection results $S_{DET\_N}$ to the output interface according to the clock Clk_3, wherein the speed of the clock Clk_2 can be equal to or slower than the speed of the clock Clk_1, and the speed of the clock Clk_3 is slower than the speed of the clock Clk_2. Since the way to realize different operating speeds with different clocks and an asynchronous FIFO are known in this technical field, their detail is omitted here.

Figure 3:
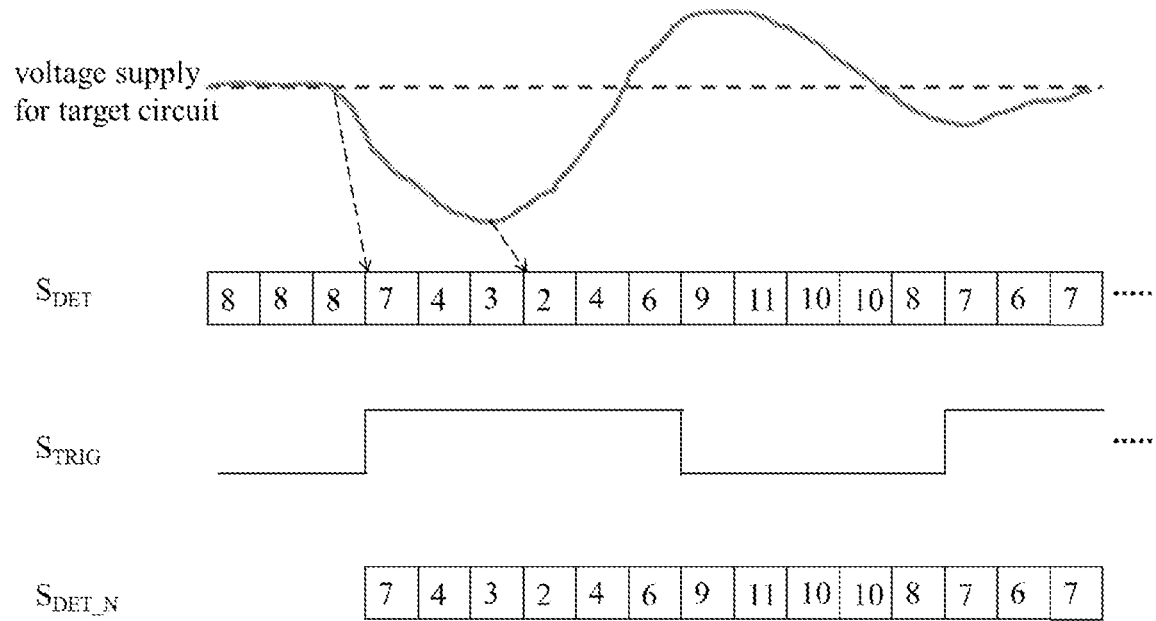
FIG. 3 shows an example of the variation in the voltage supply for the target circuit, the consequent multiple detection results, the consequent variation in the trigger signal, and the consequent N detection results of FIG. 1.

FIG. 3 shows an example of the variation in the voltage supply for the target circuit 10, the consequent multiple detection results $S_{DET}$ (i.e., a sequence of numbers: 8, 8, 8, 7, 4, 3, 2, 4, 6, 9, 11, 10, 10, 8, 7, 6, 7 . . . ), the consequent variation in the trigger signal $S_{TRIG}$, and the consequent N detection results $S_{DET\_N}$ (i.e., a sequence of numbers: 7, 4, 3, 2, 4, 6, 9, 11, 10, 10, 8, 7, 6, and 7, which indicates N=14) of FIG. 1. As shown in FIG. 3, when the voltage supply decreases (e.g., when a plurality of circuits of a system including the target circuit 10 are activated concurrently), the multiple detection results $S_{DET}$ become smaller; when a detection result (i.e., the aforementioned first detection result) is smaller than a number "8" (i.e., the aforementioned threshold value), the level of the trigger signal $S_{TRIG}$ is pulled up; and when the level of the trigger signal $S_{TRIG}$ is pulled up, the operation of reading out and then outputting the N detection results $S_{DET\_N}$ begins. It is noted that providing the earliest voltage drop in the voltage supply occurs at a first time point and the earliest result of the N detection results $S_{DET\_N}$ is generated at a second time point, there may be an interval between the first time point and the second time point based on the design of detection circuits as illustrated with the dashed arrows of FIG. 3.

It is noted that people having ordinary skill in the art can selectively use some or all of the features of any embodiment in this specification or selectively use some or all of the features of multiple embodiments in this specification to implement the present invention as long as such implementation is practicable; in other words, the way to implement the present invention can be flexible based on the present disclosure.

To sum up, the present detection result recording and outputting device of the IC can record detection results at a speed and output the detection results to the output interface of the IC at another speed even though the detection results are generated at a speed faster than the operating speed of the output interface of the IC.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A detection result recording and outputting device of an integrated circuit, the device comprising:
    a sensing circuit configured to detect a variation in a characteristic of a target circuit, and generate multiple detection results according to the variation at a first speed;
    a decision circuit configured to receive the multiple detection results, and generate a trigger signal or changes a level of the trigger signal when finding that a first detection result of the multiple detection results satisfies a predetermined condition, wherein the first detection result satisfies the predetermined condition firstly among the multiple detection results;
    a storage circuit; and
    a control circuit configured to start writing the first detection result and subsequent (N−1) detection result(s) of the multiple detection results into the storage circuit at a second speed according to the trigger signal when the first detection result satisfies the predetermined condition; and the control circuit further configured to start reading out N detection results including the first detection and the subsequent (N−1) detection result(s) from the storage circuit at a third speed when M detection result(s) of the N detection results is/are written into the storage circuit, and configured to output the N detection results read from the storage circuit to an output interface of the integrated circuit at a fourth speed,
    wherein the second speed is not higher than the first speed but higher than the fourth speed, the N is an integer greater than one, and the M is a positive integer and not greater than the N.

2. The device of claim 1, wherein the sensing circuit includes an operating speed detection circuit configured to detect an operating speed of the target circuit, and the variation in the characteristic of the target circuit is a variation in the operating speed.

3. The device of claim 1, wherein the sensing circuit includes an analog-to-digital converter configured to detect a power or a voltage of the target circuit, and the variation in the characteristic of the target circuit is a variation in the power or a variation in the voltage.

4. The device of claim 1, wherein each of the multiple detection results is a digital value, the predetermined condition is a threshold value, and the decision circuit is configured to determine whether the digital value reaches the threshold value and thereby determine whether some or all of the multiple detection results satisfy the predetermined condition.

5. The device of claim 4, wherein the decision circuit is configured to determine whether the digital value is equal to or smaller than the threshold value.

6. The device of claim 1, wherein the storage circuit has a maximum storage capacity of the N detection results.

7. The device of claim 1, wherein the control circuit includes a counter configured to count detection results written into the storage circuit, and when a total number of the detection results written into the storage circuit reaches the M, the counter requests the control circuit to read out the N detection results from the storage circuit and output the N detection results read from the storage circuit to the output interface.

8. The device of claim 7, wherein when the total number reaches the N, the counter requests the control circuit to stop writing any detection result into the storage circuit.

9. The device of claim 1, wherein the first speed is K times the second speed, and the K is an integer greater than one.

10. The device of claim 1, wherein the second speed is equal to the first speed.

11. The device of claim 1, wherein the third speed is equal to or different from the second speed.

12. The device of claim 11, wherein the third speed is slower than the second speed, and the fourth speed is equal to or different from the third speed.

* * * * *